United States Patent [19]
Lin et al.

[11] Patent Number: 5,501,997
[45] Date of Patent: Mar. 26, 1996

[54] PROCESS OF FABRICATING SEMICONDUCTOR DEVICES HAVING LIGHTLY-DOPED DRAIN

[75] Inventors: Jyh-Kuang Lin, I-Lan; Ta-Chi Kuo, Hsinchu, both of Taiwan

[73] Assignee: United Microelectronics Corp., Hsinchu City, Taiwan

[21] Appl. No.: 425,695

[22] Filed: Apr. 19, 1995

Related U.S. Application Data

[63] Continuation of Ser. No. 237,064, May 3, 1994, abandoned.

[51] Int. Cl.$^6$ ................................................. H01L 21/265
[52] U.S. Cl. ................................. 437/43; 437/44; 437/28
[58] Field of Search ................................. 437/44, 43, 28

[56] References Cited

U.S. PATENT DOCUMENTS

| | | | |
|---|---|---|---|
| 4,728,617 | 3/1988 | Woo et al. | 437/44 |
| 4,755,479 | 7/1988 | Miura | 437/44 |
| 4,757,026 | 7/1988 | Woo et al. | 437/44 |
| 4,784,965 | 11/1988 | Woo et al. | 437/44 |
| 4,908,326 | 3/1990 | Ma et al. | 437/28 |
| 4,927,777 | 5/1990 | Hsu et al. | 437/44 |
| 5,234,852 | 8/1993 | Liou | 437/44 |
| 5,275,959 | 1/1994 | Kobayashi et al. | 437/44 |
| 5,292,675 | 3/1994 | Codama | 437/44 |

FOREIGN PATENT DOCUMENTS 0541212  5/1993  European Pat. Off. ................. 437/44

*Primary Examiner*—Tuan H. Nguyen
*Attorney, Agent, or Firm*—Ladas & Parry

[57] ABSTRACT

A process for fabricating semiconductor devices having lightly-doped regions in its drain and/or source. The semiconductor device has a gate structure formed on its substrate, and the sidewalls of the gate structure covered by sidewall spacers. The sidewall spacers having a selected thickness obstructs the impurity implantation and constitutes a lightly-doped region in addition to the relatively heavily-doped regions that are not obstructed during the implantation process. Both the lightly- and heavily-doped regions together constitute the drain and/or source of the semiconductor device.

9 Claims, 2 Drawing Sheets

PROCESS OF FABRICATING SEMICONDUCTOR DEVICES HAVING LIGHTLY-DOPED DRAIN

This is a continuation of application Ser. No. 08/237,064 filed May, 3, 1994, now abandoned.

BACKGROUND OF THE INVENTION

1. Field of the Invention

This invention relates in general to semiconductor devices having lightly-doped drain and source. In particular, this invention relates to semiconductor devices having drain and source with both lightly- and heavily-doped regions. More particularly, this invention relates to the process of fabricating semiconductor devices by one single implantation procedure to obtain devices having drain and source with both lightly- and heavily-doped regions.

2. Technical Background

The continuous trend towards the miniaturization of semiconductor devices has driven integrated circuits (ICs) into the sub-micron level of device fabrication. Thermal electrons trapped in the gates of the transistors in an IC device can adversely influence the reliability of the device. This effect poses a serious problem in the sub-micron category of semiconductor devices. A fabrication process for making lightly-doped drain and source regions for ICs has been proposed, such as the process exemplified here that makes the device, which is shown in cross sections in its process stages as in FIGS. 1a to 1d.

The conventional fabrication process typified in FIGS. 1a to 1d depicts, in cross sectional views, a semiconductor IC device having lightly-doped drain and source during its fabrication process stages. The fabrication can be characterized in the following stages:

First, as is shown in FIG. 1a, a semiconductor substrate 1 (of the P or N type) has a Field region OXide layer 10 (FOX) formed on its top surface which defines an active region 12. A gate oxide layer 140 and polysilicon layer 142 are further fabricated on the active region 12 to define a gate 14.

Secondly, as can be seen in FIG. 1b, impurities (N-type impurities such as P, or P-type impurities such as B) are implanted to form lightly-doped regions 160 (N- or P-implantation regions). Typically, N-type impurities are implanted into a P-type substrate while P-type impurities are implanted into a N-type substrate.

Next, FIG. 1c shows that a sidewall spacer 18 is formed on each side wall of the gate 14 by, for example, depositing a layer of oxide and then etching back by plasma etching.

Finally, as is shown in FIG. 1d, further impurities (N or P type) are implanted to form heavily-doped regions 162 ($N^+$ or $P^+$ implantation regions). Due to the fact that sidewalls 18 obstruct the impurities from entering into the lightly-doped regions 160 during this second implantation process, the implantation concentration in the regions 160 of drain and source 16 remain relatively light as compared to that in regions 162.

Two implantation procedures, however, in addition to the use of conventional photoresist and etching procedures, are required in the above exemplified fabrication procedure, which procedure is typically employed in the prior art. This relatively complicated fabrication procedure is not suitable for the efficient and cost-effective mass production of IC devices.

SUMMARY OF THE INVENTION

It is therefore an object of the present invention to provide a fabrication process for forming lightly-doped drain and source regions on the substrate of a semiconductor device having a gate.

It is another object of the present invention to provide a fabrication process for forming source and drain on the substrate of the semiconductor device each having both lightly- and heavily-doped regions.

It is still another object of the invention to provide a fabrication process for forming source and drain on the substrate of the semiconductor device having both lightly- and heavily-doped regions in only one implantation procedure.

BRIEF DESCRIPTION OF THE DRAWING

Other objects, features and advantages of the present invention will become apparent by way of the following detailed description of the preferred but non-limiting embodiment, with reference to the accompanied drawings, wherein.

DETAILED DESCRIPTION OF THE PREFERRED EMBODIMENT

Figure 2A:
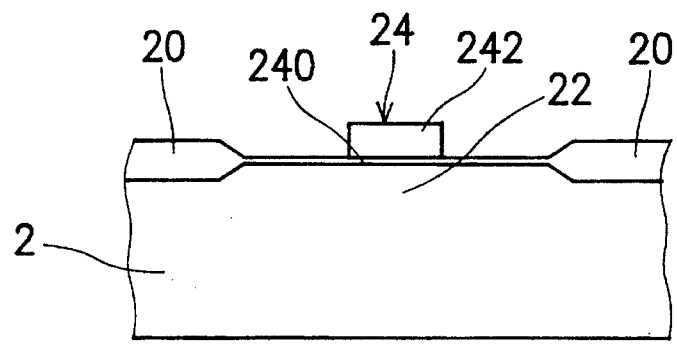
FIGS. 2a–2c show, in cross section, a semiconductor device at various process stages based on the fabrication procedure in accordance with the preferred embodiment of the present invention.
Figure 2B:
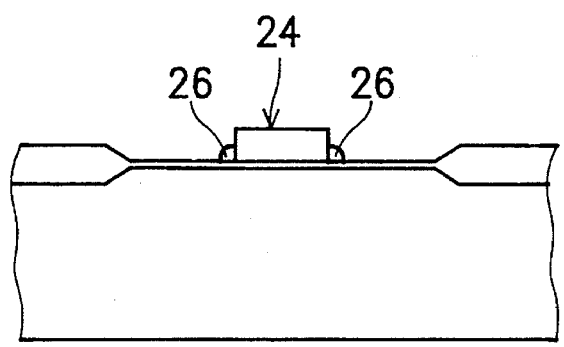
Figure 2C:
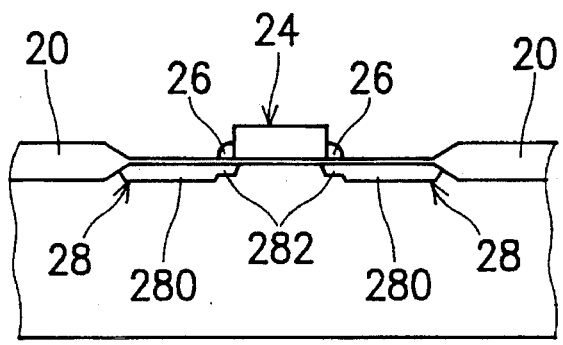

FIGS. 2a–2c depict a semiconductor device made in accordance with a preferred embodiment of the present invention is shown in cross section at various stages of fabrication.

Step 1

Figure 1A:
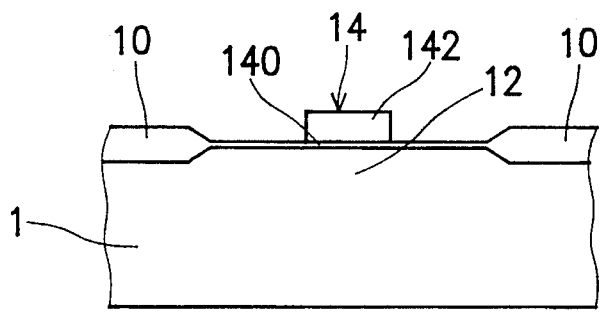
FIGS. 1a–1d show, in cross section, a semiconductor device at various process stages based on a prior art fabrication procedure.
Figure 1B:
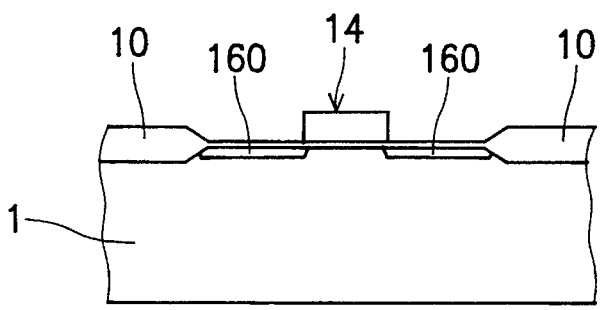

Referring first to FIG. 2a, on the P- or N-type semiconductor substrate 2, a field region oxide layer 20 is formed to define an active region 22. A gate oxide layer 240 and a polysilicon layer 242 are then formed on area 22 to define a gate 24. This process step is basically the same as that of the prior art, if comparison is made to the cross section shown in FIG. 1a.

Step 2

Figure 1C:
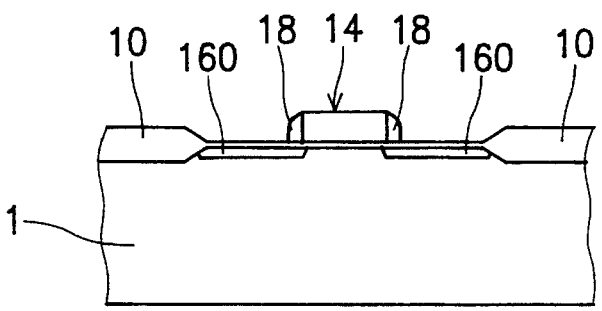
Figure 1D:
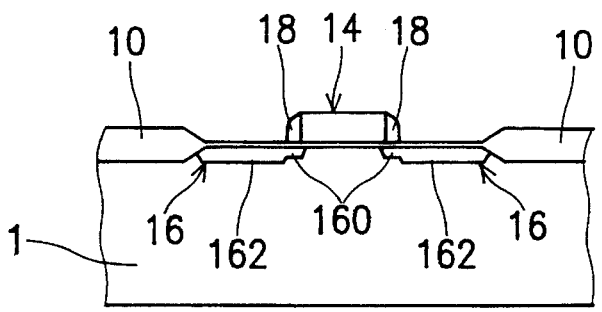

Turning to FIG. 2b, sidewall spacers 26 are then formed on the side walls of gate 24. The thickness of the sidewall spacers 26, as measured in a direction normal to the substrate 2 is smaller than the thickness of the sidewall spacer 18 in the prior art device as shown in FIG. 1c. As can be seen from FIG. 2b, this thickness is also less than that of gate 24. The use of this smaller thickness allows partial passage of the implantation impurities into the substrate during a later implantation procedure to form a lightly-doped implantation region, as will be described in detail below.

To make the spacers 26, a layer of oxide, nitride, or polysilicon is deposited first, and then plasma etching is utilized to define the shapes of the sidewall spacers 26, so that the spacers 26 have a typical thickness (normal to the substrate 2) of about 500–2,500Å. The thickness of the gate 24 is usually about 4000 Å. Thus the thickness of the sidewall spacers 26 are less than the thickness of gate 24 adjacent which they are disposed. The sidewall spacers 26 are preferably made of a material selected from nitride and polysilicon, so as to avoid damaging the substrate 2 when plasma etching is used.

Step 3

Referring now to FIG. 2c, at this stage, impurities (of N- or P-type) are implanted into the substrate 2 to form heavily-doped regions 280 ($N^+$ or $P^+$ doped). N-type impurities are preferably implanted into a P-type substrate 2 while P-type impurities are preferably implanted into a N-type substrate 2. Due to partial obstruction of implantation of the impurities by the presence of the spacers 26, the regions 282 underneath the spacers will be lightly-doped (N- or P- doped) compared with the other regions, namely regions 280, which are not obstructed by the spacers 26 during the implantation process. The gate 24 is sufficiently thick to block this implantation, while the spacers 26 are only sufficiently thick to obstruct, but not block, this implantation. The heavily-doped regions 280 and lightly-doped regions 282 together constitute the drain and source regions 28.

Thus, the present invention achieves the formation of a drain and a source on the semiconductor substrate with both lightly- and heavily-doped regions of type which are required for sub-micron fabrication of semiconductor integrated circuit devices. Moreover, the lightly- and heavily-doped regions are formed in one single implantation step, which simplifies the over fabrication procedure, as well as achieving reduced production costs.

Having described the invention in connection with a preferred embodiment, modification may now suggest itself to those skilled in the art. Thus the invention is not to be limited to the disclosed embodiment, except as required by the appended claims.

We claim:

1. A process for fabricating a semiconductor device having an active region and having a gate structure formed on a substrate, said gate structure having a gate thickness, said process comprising the steps of:

forming a sidewall spacer on at least one sidewall of said gate structure by depositing a single insulating layer over the substrate and the gate structure and etching back the insulating layer to form the sidewall spacer, said sidewall spacer having a sidewall spacer thickness measured in a depth direction of said substrate such that an impurity implantation applied to said sidewall spacer is only obstructed but not blocked by said sidewall spacer thickness, said sidewall spacer thickness being less than said gate thickness; and implanting impurities to form at least one lightly-doped region underneath said sidewall spacer while at the same time forming at least one heavily-doped region in the area not obstructed by said sidewall spacer, said at least one lightly-doped region being adjacent to said at least one heavily-doped region and defining with the adjacent heavily-doped region said active region of said semiconductor device.

2. The process of claim 1, wherein said sidewall spacer is a nitride spacer.

3. The process of claim 2, wherein said sidewall spacer thickness is in the range of 500–2,500Å.

4. The process of claim 1, wherein said sidewall spacer is an oxide spacer.

5. The process of claim 4, wherein said sidewall spacer thickness is in the range of 500–2,500Å.

6. The process of claim 1, wherein said sidewall spacer is a polysilicon spacer.

7. The process of claim 6, wherein said sidewall spacer thickness is in the range of 500–2,500Å.

8. The process of claim 1, wherein said active region defines a source region.

9. The process of claim 1, wherein said active region defines a drain region.

\* \* \* \* \*